United States Patent
Yang et al.

(10) Patent No.: US 7,547,590 B2
(45) Date of Patent: Jun. 16, 2009

(54) METHOD FOR FORMING AN ARRAY SUBSTRATE INCLUDING FORMING A TRANSPARENT CONDUCTIVE LAYER ON A PHOTORESIST AND LASER ABLATING

(75) Inventors: Chih-Chun Yang, Hsinchu (TW); Chih-Hung Shih, Hsinchu (TW); Ming-Yuan Huang, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 273 days.

(21) Appl. No.: 11/744,934

(22) Filed: May 7, 2007

(65) Prior Publication Data

US 2008/0044953 A1 Feb. 21, 2008

(30) Foreign Application Priority Data

Jul. 3, 2006 (TW) .............................. 95124150 A

(51) Int. Cl.
H01L 21/00 (2006.01)
H01L 21/84 (2006.01)
H01L 21/302 (2006.01)
H01L 21/461 (2006.01)

(52) U.S. Cl. .................. 438/149; 438/708; 438/951

(58) Field of Classification Search .................. 438/149, 438/709, 951; 257/E21.028
See application file for complete search history.

(56) References Cited

U.S. PATENT DOCUMENTS

| 6,356,320 B1 | 3/2002 | Chung et al. |
|---|---|---|
| 6,593,978 B2 | 7/2003 | Vu et al. |
| 6,700,631 B1 | 3/2004 | Inoue et al. |
| 6,885,389 B2 | 4/2005 | Inoue et al. |
| 6,913,957 B2 | 7/2005 | Yang |
| 7,060,541 B2 | 6/2006 | Lee et al. |
| 7,206,057 B2 | 4/2007 | Yoo et al. |
| 2005/0242365 A1 | 11/2005 | Yoo |
| 2005/0247950 A1 | 11/2005 | Nakamura et al. |
| 2006/0003553 A1 | 1/2006 | Park et al. |
| 2007/0081107 A1* | 4/2007 | Huitema et al. ............... 349/42 |
| 2007/0170435 A1 | 7/2007 | Yoo et al. |

FOREIGN PATENT DOCUMENTS

| TW | 588462 | 5/2004 |
|---|---|---|
| TW | 589745 | 6/2004 |
| TW | 220534 | 8/2004 |
| TW | 254911 | 5/2006 |

OTHER PUBLICATIONS

TW Search Report mailed May 28, 2008.

* cited by examiner

*Primary Examiner*—William M. Brewster
(74) *Attorney, Agent, or Firm*—Thomas, Kayden, Horstemeyer & Risley

(57) ABSTRACT

Disclosed is a method for manufacturing an array substrate utilizing a laser ablation process. With the laser ablation process, a photoresist layer is removed along with the transparent conductive layer therefrom, while maintaining other portions of the transparent conductive layer. Moreover, the laser ablation process of the invention does not need additional photomask, so the fabrication cost can be reduced.

16 Claims, 11 Drawing Sheets

US 7,547,590 B2

METHOD FOR FORMING AN ARRAY SUBSTRATE INCLUDING FORMING A TRANSPARENT CONDUCTIVE LAYER ON A PHOTORESIST AND LASER ABLATING

BACKGROUND OF THE INVENTION

1. Field of the Invention

The present invention relates to a method for forming an array substrate and, most particularly, to use of a laser ablation process to manufacture the array substrate.

2. Description of the Related Art

Liquid crystal display (LCD) operation, in which angles of liquid crystal molecules are changed to control light transmission, conventionally requires a liquid crystal layer disposed between a color filter substrate and a thin film transistor (TFT) array substrate. As shown in FIGS. 1A-1E, TFT array substrate fabrication comprises five photo mask processes. A display region (not shown) of the substrate 10 has plurality of pixels, each defined in two areas, with area I acting as a TFT and area II acting as a storage capacitor. FIG. 1A shows a metal layer formed on the substrate 10, patterned by a first photo mask, forming a gate electrode 11A in area I and a bottom electrode 11B in area II, respectively. As shown in FIG. 1B, a dielectric layer 12, a semiconductor layer, and a doped semiconductor layer are sequentially formed on the structure and patterned by a second photo mask, forming a channel layer 13 and an ohmic contact layer 14 in area I. As shown in FIG. 1C, a metal layer is formed and patterned by a third photo mask to form source/drain electrodes 15. The ohmic contact layer not masked by the source/drain electrodes 15 is etched simultaneously. As shown in FIG. 1D, a passivation layer 17 is formed and patterned by a fourth photo mask to form a contact hole 16 exposing a part of the drain electrode 15 of the TFT. A conductive layer is then formed overlying the structure and patterned by a fifth photo mask. As shown in FIG. 1E, the patterned conductive layer 18 acts as a top electrode in area II and pixel electrode (not shown) electrically connecting to the drain electrode 15 through the contact hole 16 (see FIG. 1D).

In addition to the lithography process, organic or inorganic material layers can be patterned by laser ablation such as disclosed in U.S. Pat. Pub. No. 2005/0242365, 2006/0003553, 2005/0247950. The laser ablation cannot selectively pattern, it is necessary to use a photo mask, thereby increasing costs. Compared to other lithography light sources, large area exposure is difficult in laser source. The photo mask alignment also complicates the machine integration. Accordingly, a selective laser ablation process requiring no photo mask is called for.

SUMMARY OF THE INVENTION

The present invention provides a laser ablation process requiring no photo mask to selectively pattern a transparent conductive layer, thereby reducing the fabrication cost of the TFT array substrate of the LCD.

The present invention provides a method for manufacturing an array substrate, comprising providing a substrate, forming a contact pad, a thin film transistor (TFT), a pixel region, and a storage capacitor on the substrate, forming a passivation layer on the contact pad, the TFT, the pixel region, and the storage capacitor, forming a patterned photoresist layer on the passivation layer, removing part of the passivation layer un-covered by the patterned photoresist layer to expose the pixel region, part of the TFT, part of the storage capacitor, and part of the contact pad, forming a transparent conductive layer on the patterned photoresist layer, on the exposed pixel region, on the exposed part of the TFT, on the exposed part of the storage capacitor, and on the exposed part of the contact pad, and applying a laser ablation process to remove the patterned photoresist layer and the transparent conductive layer on the patterned photoresist layer, so that the transparent conductive layer remains on the pixel region, on the part of the TFT, on the part of the storage capacitor, and on the part of the contact pad.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

A detailed description is given in the following embodiments with reference to the accompanying drawings.

The following description is of the best-contemplated mode of carrying out the present invention. This description is made for the purpose of illustrating the general principles of the invention and should not be taken in a limiting sense. The scope of the present invention is best determined by reference to the appended claims.

Figure 1A:
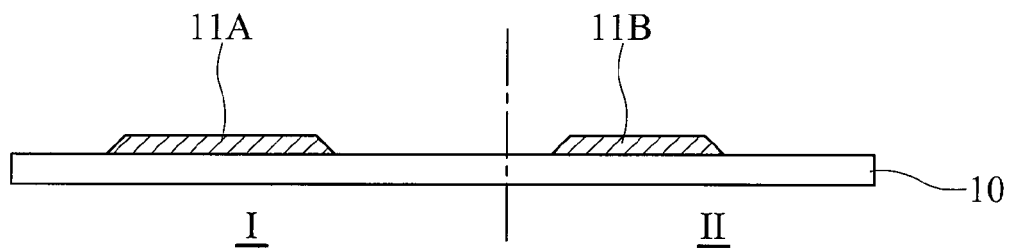
FIGS. 1A-1E are serial cross-sectional views of processes in conventional TFT array substrate fabrication.
Figure 1B:
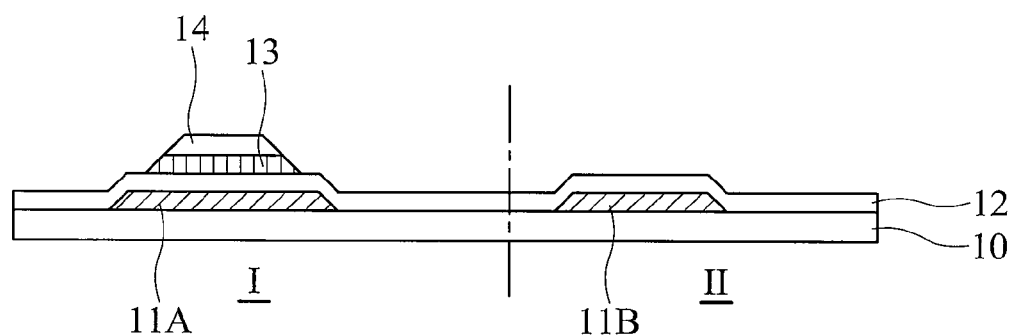
Figure 1C:
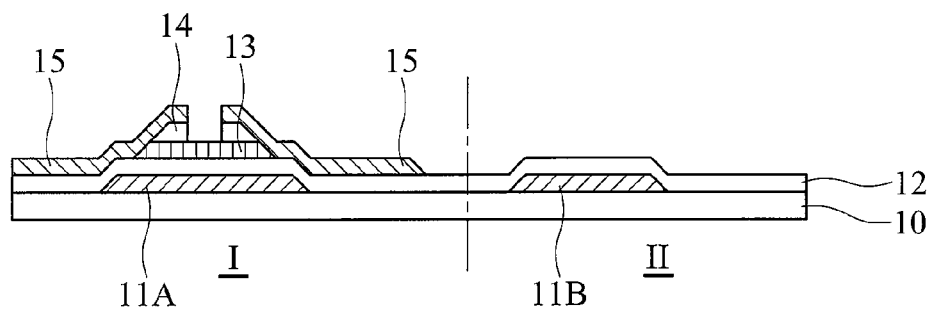
Figure 1D:
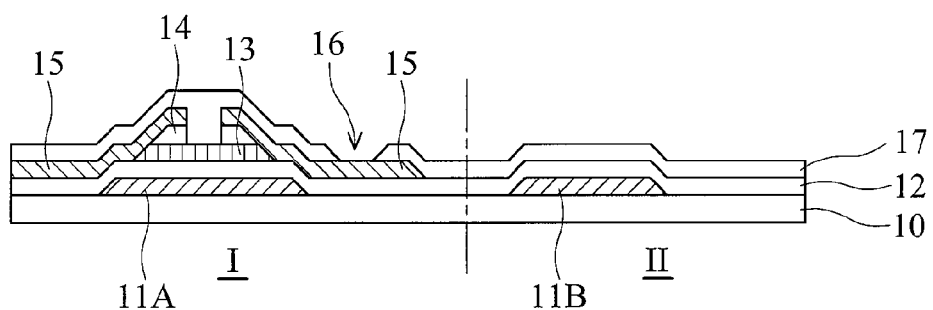
Figure 1E:
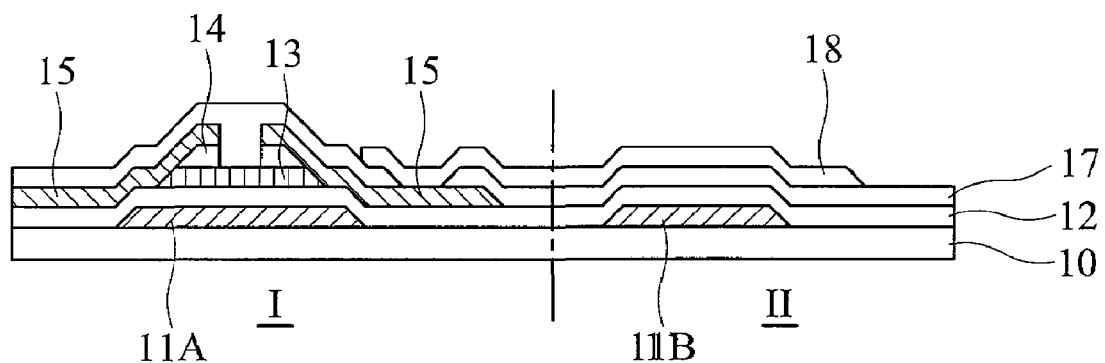
Figure 2A:
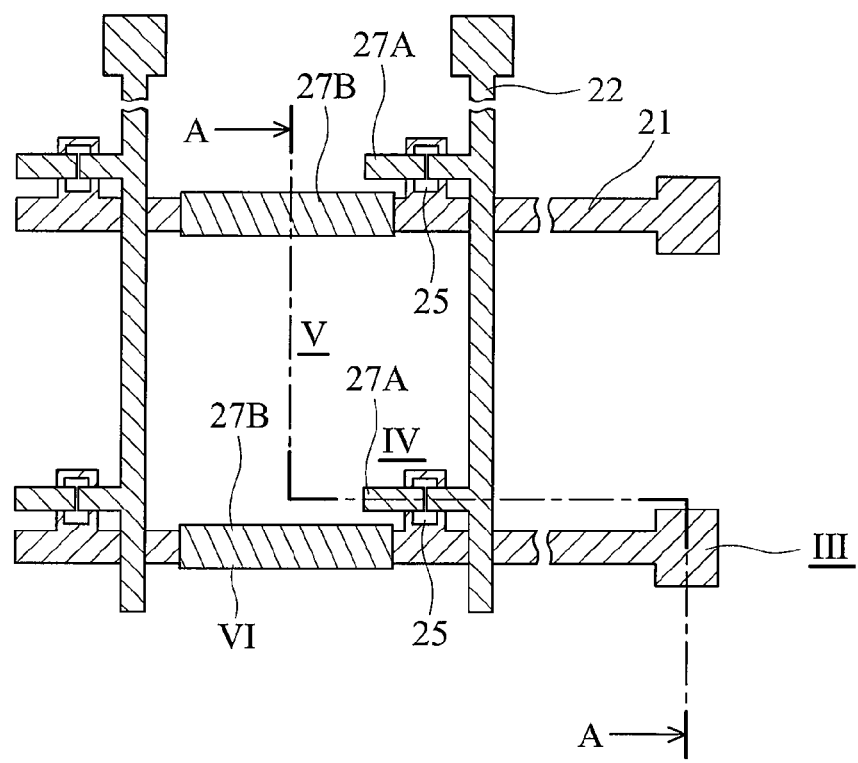
FIG. 2A is a top-view of an array substrate of an embodiment of the present invention.

FIG. 2A is a top-view of an array substrate of an embodiment of the present invention. Gate lines 21 crosses data lines 22 to form the pixel region V with at least one TFT IV to control an orientation of the liquid crystal molecules. The terminals of the gate lines 21 and data lines 22 are contact pads III, and a top electrode 27B is formed overlying part of the gate lines 21 to form a storage capacitor VI. While one TFT is charted in FIG. 2A, pixel region V may contain more than one TFT or other kind of TFT such as storage capacitor controlling TFT, current flow controlling TFT, other TFT, or combination thereof. Furthermore, while the storage capacitor VI utilizes part of the gate lines 21 as bottom electrode, those skilled in the art will appreciate that the storage capacitor VI may utilize other gate lines such as common electrode (not shown) as bottom electrode.

Figure 2B:
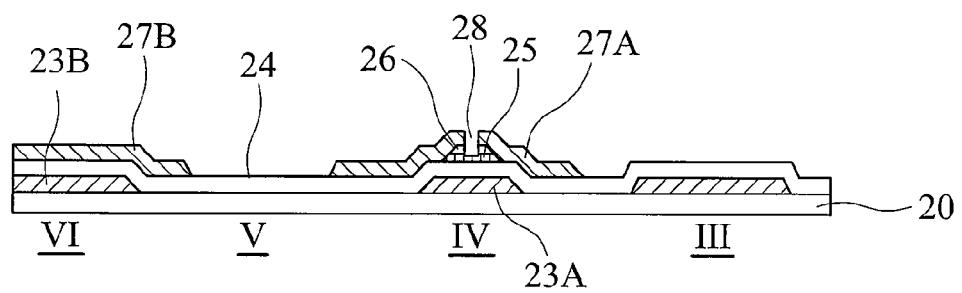
FIGS. 2B-2E are serial cross-sectional views of a method of the embodiment of the present invention along the A-A line of FIG. 2A.

FIG. 2B is a cross-sectional view of dashed line A-A in FIG. 2A. III is a contact pad in gate line terminal, IV is a TFT, V is a pixel region, and VI is a storage capacitor. A first patterned metal layer is formed on the substrate 20, the method for forming the first patterned metal layer on the substrate, for example, a first metal layer is formed on the substrate 20, patterned to expose pixel region V and to form the contact pad III, the gate electrode 23A of the TFT IV, the gate lines 21, and the bottom electrode 23B of the storage capacitor VI, but not-limited it. The material of the substrate includes transparent material (such as glass, quartz, and the like), opaque material (such as ceramic, wafer, and the like), or flexible material (such as plastic, rubber, polyester, polycarbonate, and the like). The first metal layer comprises metal (such as Ti, Ta, Ag, Au, Pt, Cu, Al, Mo, Nd, W, Cr, Rh, Re, Ru, Co, or other metal), alloy, or combinations thereof, preferably, for example a Mo/AlRu alloy, Mo/AlRu alloy/Mo, or Mo/Al/Mo, but not-limited it. A dielectric layer 24 is formed on the contact pad III, on the gate electrode 23A of the TFT IV, on the gate lines 21, on the bottom electrode 23B of the storage capacitor VI, and on the exposed part of the substrate 20. The dielectric layer 24 acts as a gate dielectric layer of the TFT IV and a capacitor dielectric layer of the storage capacitor VI. The dielectric layer 24 comprises an organic material (i.e. photoresist, organosilicone, or the like), an inorganic material (i.e. silicon nitride, silicon oxide, silicon oxynitride, silicon carbide, silicon oxycarbide, or likes, or combinations thereof), or combinations thereof. A channel layer and an ohmic contact layer are formed on the dielectric layer. The ohmic contact layer normally is a doped silicon layer, optionally n-type, p-type, or combinations thereof. At leas one of the materials of the channel layer and the ohmic contact layer includes amorphous silicon, polysilicon, microcrystalline silicon, single crystalline silicon, or combinations thereof. At leas one of the channel layer and the ohmic contact layer include formed by chemical vapor deposition (CVD), plasma enhanced CVD (PECVD), rapid thermal CVD (RECVD), ultra high vacuum CVD (UHVCVD), or molecular beam epitaxy (MBE). The channel layer and the ohmic contact layer are sequentially patterned by lithography, remaining the ohmic contact layer 26 and the channel layer 25 of the TFT IV, with other parts removed.

As shown in FIG. 2B, a second patterned metal layer is formed on the substrate to form source/drain electrodes 27A of the TFT IV, the top electrode 27B of the storage capacitor VI, and data lines 22, and has a opining 28 to expose the part of the channel layer 25, the method for forming the second patterned metal layer on the substrate, for example, a second metal layer is formed on the substrate 20 by evaporation or physical vapor deposition (PVD), and then is patterned to act as source/drain electrodes 27A of the TFT IV, the top electrode 27B of the storage capacitor VI, and data lines 22. The opening 28 is formed simultaneously to expose part of the channel layer 25. The patterning method, such as lithography or etching (such as wet etching or dry etching) removes part of the second metal layer to form source/drain electrodes 27A, and remove part of the ohmic contact layer 26 to expose part of the channel layer 25, but not-limited it. The material of the second metal layer comprises metal (such as Ti, Ta, Ag, Au, Pt, Cu, Al, Mo, Nd, W, Cr, Rh, Re, Ru, Co, or other metal), alloy, or combinations thereof, preferably, for example a Mo/AlRu alloy, Mo/AlRu alloy/Mo, or Mo/Al/Mo, but notlimited it. Referring to FIG. 2A, the data lines 22 electrically connect to drain electrode 27A. Gate lines 21, data lines 22, contact pad III, TFT IV, pixel region V, and storage capacitor VI are formed on the substrate 20. As shown in FIG. 2B, storage capacitor VI comprises dielectric layer 24 between the top electrode 27B and the bottom electrode 23B; TFT IV comprises gate electrode 23A, the dielectric layer 24, the channel layer 25, with ohmic contact layer 26, and source/drain electrodes 27A; and contact pad III of the same material as the gate electrode 23A and the bottom electrode 23B.

Figure 3A:
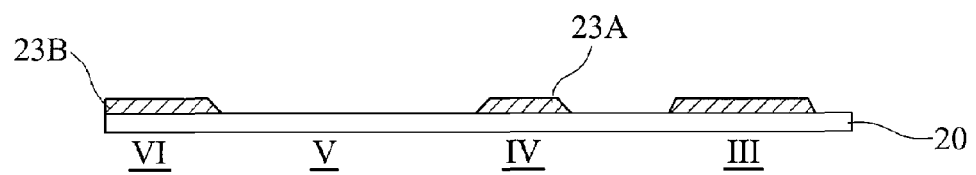
FIGS. 3A-3G are serial cross-sectional views of processes in another embodiment of the present invention.
Figure 3B:
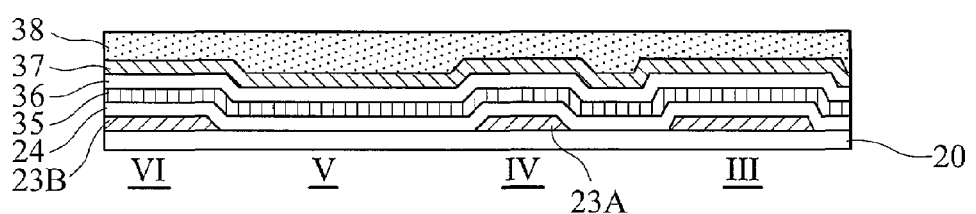

The method for fabricating the array substrate in FIG. 2A is not limited to the above-mentioned process, and other methods such as those shown in FIGS. 3A-3F may be used, wherein like symbols represent like elements in FIG. 2B for convenience. Referring to FIG. 3A, a first patterned metal layer is formed on the substrate 20, the method for forming the first patterned metal layer on the substrate, for example, a first metal layer is formed on the substrate 20, patterned to expose pixel region V and to form the contact pad III, the gate electrode 23A of the TFT IV, the gate lines 21, and the bottom electrode 23B of the storage capacitor VI, but not-limited it. Materials and fabrication of the first metal layer are similar to those in FIG. 2B. Next, as shown in FIG. 3B, the dielectric layer 24, the channel layer 35, the ohmic layer 36, the second metal layer 37, and the photoresist layer 38 are sequentially formed on the first patterned metal layer and on the exposed substrate. Materials and fabrication of the multi layer structure are similar to those in FIG. 2B.

Figure 3C:
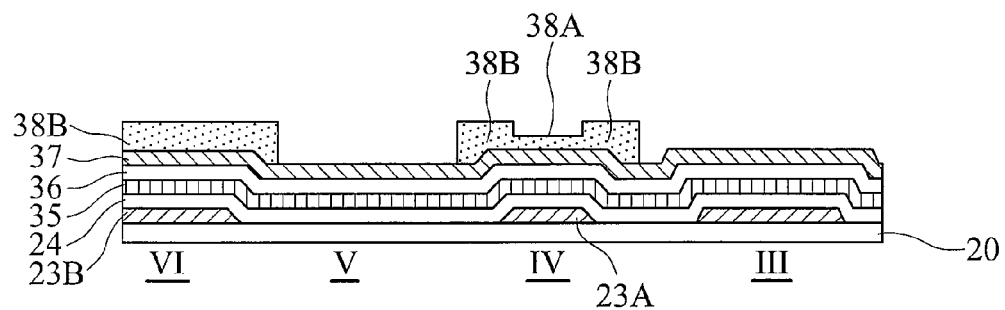

As shown in FIG. 3C, the photoresist layer 38 is patterned by lithography to form photoresist regions 38A and 38 B with different thicknesses on the multilayer structure. The photo masks of the lithography process may be half-tone, gray-level, slit-pattern, diffractive, or the like. The thin photoresist region 38A is formed on the multilayer structure and substantially aligns with part of the predetermined channel region or part of the gate electrode. The thick photoresist region 38B is formed on the multilayer structure and substantially aligns with the predetermined data lines 22, top electrode of the storage capacitor VI, and source/drain electrodes of the TFT IV. Part of the photoresist layer 38 on the pixel region V and the contact pad III is removed.

Figure 3D:
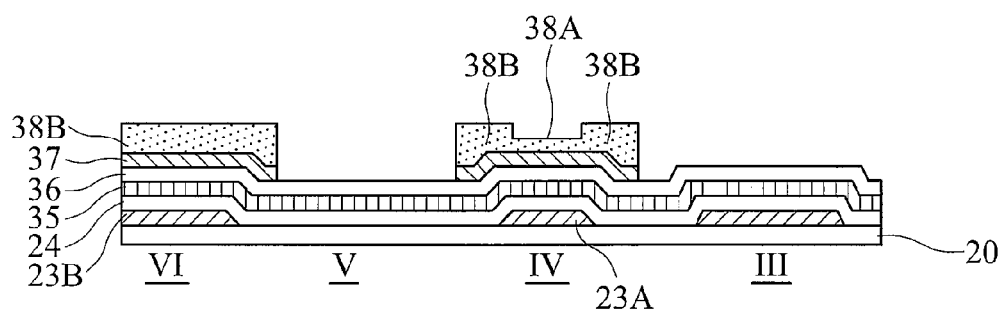
Figure 3E:
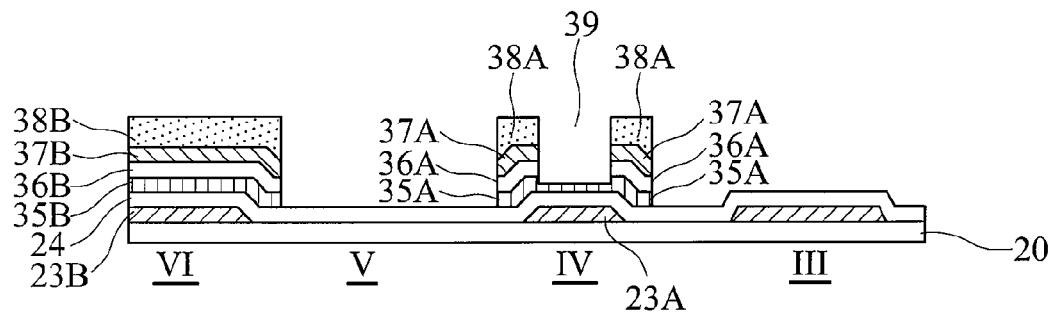

As shown in FIG. 3D, the exposed second metal layer 37 in the pixel region V and the contact pad III is etched. This etching step defines the top electrode 37 B and exposed part of the ohmic contact layer 36. Next as shown in FIG. 3E, a plasma process is applied to remove the thin photoresist region 38A and to expose the second metal layer 37 on the channel layer. Note that the plasma process removes not only the thin photoresist region 38A but also part of the thick photoresist region 38B, thereby reducing thickness and width of the thick photoresist region 38B. The second metal layer 37 on the channel region, the exposed part of the ohmic contact layer 36, and the exposed part of the channel layer 35 are etched. Simultaneously, another parts of the ohmic contact layer 36 and channel layer 35 un-covered by the thick photoresist region 38B are removed. Referring to FIG. 3D, the second metal layer 37 is remained on the channel region of the TFT IV other than on the contact pad III and the pixel region V. While the channel layer 35 and the ohmic contact layer 36 on the contact pad III and on the pixel region III are etched, only the second metal layer 37 and the ohmic contact layer 36 of the TFT IV are etched, such that part of the channel layer 35A of the TFT IV is selectively remained. Thus, top electrode 37B of the storage capacitor IV, source/drain electrodes 37A of the TFT IV, the ohmic contact layers 36A and 36B, channel layers 35A and 35B, and the opening 39 are defined.

The structure in FIG. 3E can be formed by other methods as follows. The second metal layer 37, the ohmic contact layer 36, and the channel layer 35 not covered by the thin and thick photoresist region 38A and 38B can be pre-etched to expose part of the dielectric layer 24. After performing a plasma process to remove thin photoresist region 38A, and to expose the second metal layer 37 on the channel region, the second metal layer 37, part of the exposed ohmic contact layer, and part of the exposed channel layer 35A are sequentially etched.

Figure 2C:
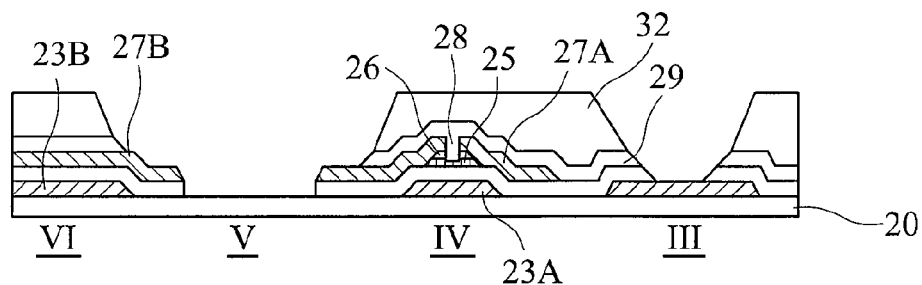
Figure 2D:
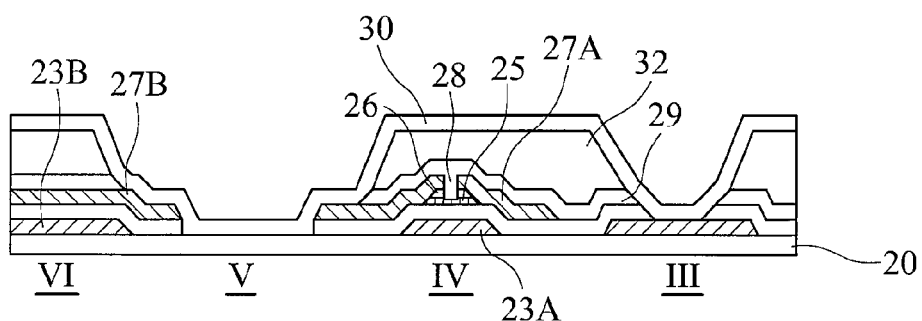
Figure 2E:
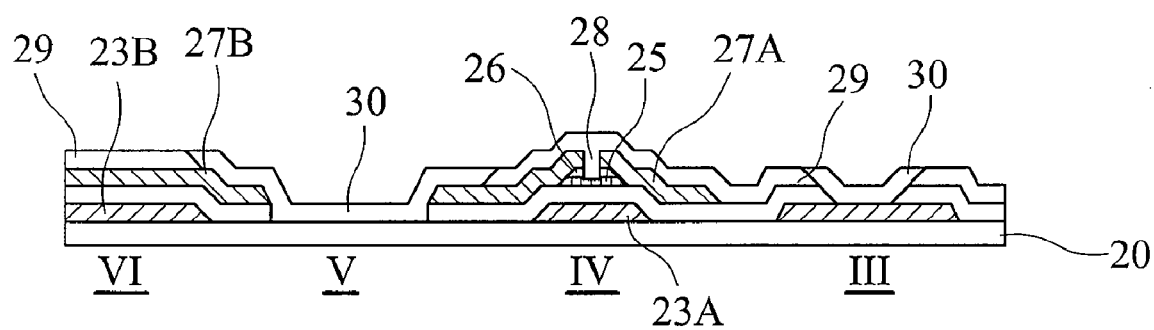
Figure 3F:
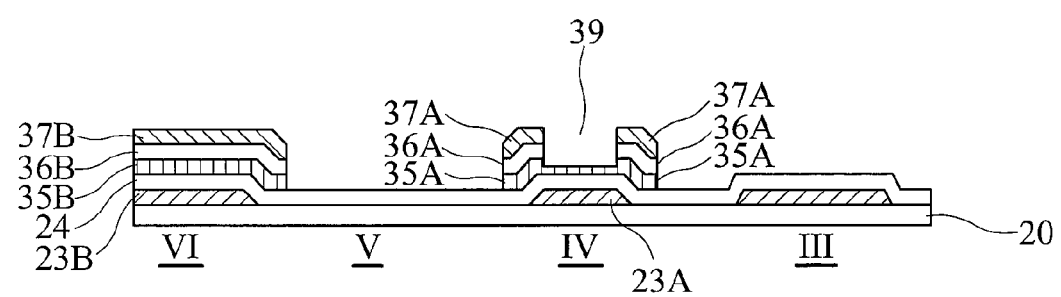

As shown in FIG. 3F, the thick photoresist region 38B is removed. The storage capacitor VI contains the dielectric layer 24, the channel layer 35B, and the ohmic contact layer 36B disposed between the top electrode 37B and the bottom electrode 23B. The TFT IV contains the gate electrode 23A, the dielectric layer 24, the channel layer 35A, the ohmic contact layer 36A, and the source/drain electrodes 37A. The contact pad III has similar material to the gate electrode 23A and the bottom electrode 23B. Comparing to the process in FIG. 2B, the second metal layer 27 in FIG. 2B is formed after patterning the ohmic contact layer 26 and the channel layer 25 with a photo mask. Whereas, the process in FIGS. 3A-3F firstly forms the channel layer 35, the ohmic contact layer 36, the second metal layer 37, and the photoresist layer 38, and then forms the photoresist regions 38A and 38B of different thicknesses by a half-tone photo mask, thereby further patterning the multi layer structure. The process in FIG. 3F reduces one photo mask than that in FIG. 2B. Subsequent processes are similar to those in FIGS. 2C-2E.

As shown in FIG. 2C, a passivation layer 29 and a patterned photoresist layer 32 are sequentially formed on the substrate. The method for forming the patterned photoresist layer 32 on the substrate includes, for example, forming a photoresist layer 32 on the substrate 20, patterning the photoresist layer (such as exposure and development step) to expose part of the passivation layer 29 on part of the contact pad III, on part of the source electrode 27A of the TFT IV, on the exposed substrate 20 in the pixel region V, and on part of the storage capacitor VI, but not-limited it. The remained patterned photoresist layer 32 acts as a mask, the exposed part of the passivation layer 29 and underlying dielectric layer 24 are etched to expose part of the contact pad III, part of the source/drain electrodes 27A of the TFT IV, substrate 20 in the pixel region V, and part of the top electrode 27B of the storage capacitor VI. The materials for passivation layer 29 include inorganic material (such as silicon nitride, silicon oxide, silicon oxynitride, silicon carbide, silicon oxycarbide, or combinations thereof), organic material (such as organic silicon compound, organic polymer, and the like), or combinations thereof. The passivation layer 29 can be formed by CVD, PECVD, or metal organic CVD (MOCVD). Formation of the photoresist layer 32 can use spin-on or spinless coating.

As shown in FIG. 2D, a transparent conductive layer 30 is formed on the structure shown in FIG. 2C. A laser ablation process is then performed on the above-mentioned structure shown in FIG. 2D to form a structure shown in FIG. 2E. The transparent conductive layer 30 may be transparent metal oxide, preferably, for example, indium tin oxide, indium zinc oxide, cadmium tin oxide, aluminum zinc oxide, or combinations thereof, but not-limited it. Because the laser directly passes through the transparent conductive layer 30 and reaches to the patterned photoresist layer 30 to simultaneously ablate the patterned photoresist layer 30 and part of the transparent layer on the patterned photoresist layer 30. The other part of transparent conductive layer 30 is not on the patterned photoresist layer 30 is remained, such as conductive layer 30 on the contact pad III, on the part of the source electrode 27A, on the substrate 20 in the pixel region V, and on the top electrode 27B of the storage capacitor VI.

Figure 3G:
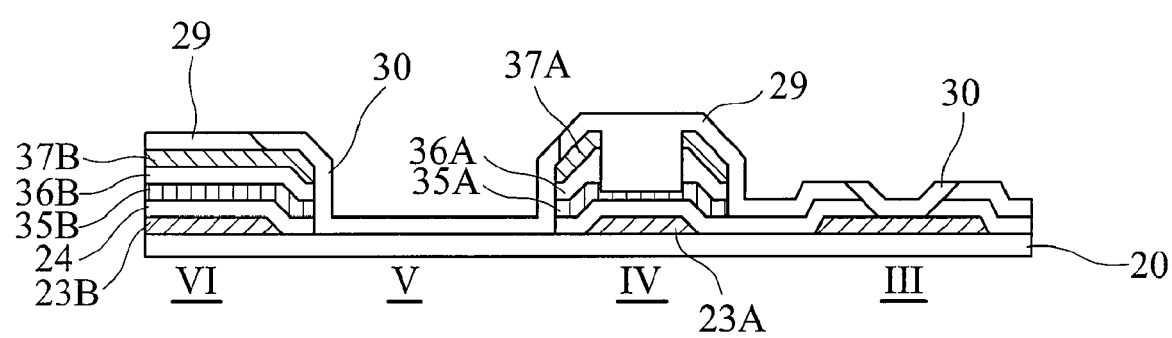

FIG. 3G shows the structure resulting from the processes of FIGS. 2C-2E performed on the structure of FIG. 3F. The laser ablation process and materials/fabrication method of the passivation layer 29 and the conductive layer 30 is omitted due to its similarity to that shown to FIGS. 2C-2E.

Note that the material of the patterned photorsist layer 32 influences the choice of wavelength and energy of the laser. For example, the laser used to ablate GE4CK1 (commercial available photoresist from Tokyo Ink) is preferably YAG laser source with a wavelength substantially greater than or substantially equal to 900 nm, such as 1064 nm YAG laser. In a preferred embodiment, the laser has an energy of about 650 mJ—about 1800 mJ. The photoresist layer 32 of the present invention is not limited to GE4CK1, and appropriate photoresist layer and corresponding laser type, wavelength, and energy can be chosen. The choice of the laser, to transmit it's to the transparent conductive layer 30, is un-absorbed by the transparent conductive layer 30, and selectively to ablate the photoresist layer 32 on the passivation layer 29. Note that only photoresist layer 32 is ablated, the other layers under the transparent conductive layer 30 cannot be influenced by the laser ablation process. For example, the passivation layer 29 is preferably inorganic material for preventing removal with the photoresist layer 32, simultaneously. If the passivation layer 29 adapts to organic material such as organic silicon compound, the bond dissociation energy of the organic material should substantially greater than the energy of the laser ablation process.

Figure 4A:
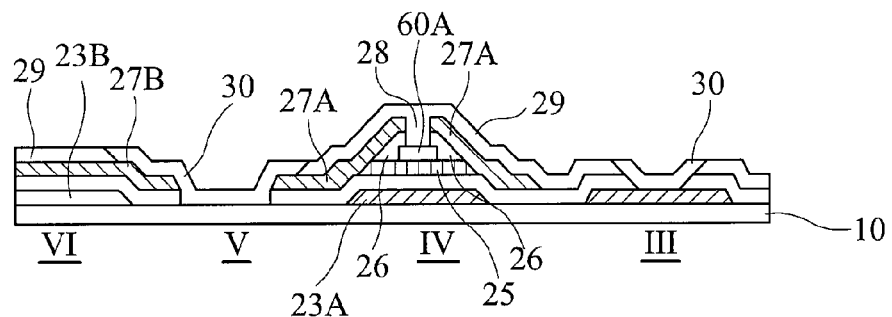
FIGS. 4A-4B are cross-sectional views of array substrates with an I-stopper in a further embodiment of the present invention.
Figure 4B:
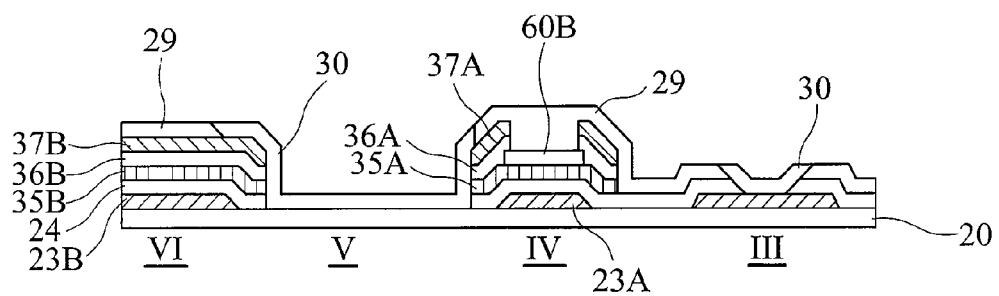

The TFT IV of FIGS. 2E and 3G is formed by back channel etching type, although it is understood that other process (i-stopper) may be applied. Compared to FIGS. 2E and 3G, the structures in FIGS. 4A and 4B also have substrate 20, contact pad III, TFT IV, pixel region V, and storage capacitor VI. The difference between FIGS. 4A and 2E is an etch stop layer 60A formed on the channel layer 25 before the ohmic contact layer 26 formed. The difference between FIGS. 4B and 3F is an etch stop layer 60B formed on the channel layer 35A before the ohmic contact layer 36A formed. Or namely, the etch stop layer 60B is formed between the channel layer and the ohmic contact layer. The etch stop layer 60B to prevent from denting the channel layers 25 and 35A in the back etching step.

Several array substrates of the embodiments of the present invention can be further applied in various display such as liquid crystal display (LCD), electro luminescent display, field emission display, carbon nanotube display, and the like, wherein the electro luminescent display includes organic (e.g. small molecule or polymer) or inorganic electro luminescent display, or likes. In additional, at least one of the array substrate and the display applied in the electro-optical apparatus such as mobile product (such as phone cell, video camera, notebook, play apparatus, watch, music player, receive and send to e-mail apparatus, map guider, digital camera, or likes), video-sound product (such as video-sound player, or likes), monitor, TV, billboard, signboard, or likes. Wherein the electro-optical apparatus further comprising electric device (not shown) is electrically connected to the display, such as control device, operate device, processing device, input device, memory device, driving device, luminous device, protecting device, or other function device, or combinations thereof.

While the present invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing an array substrate, comprising:
   providing a substrate;
   forming a contact pad, a thin film transistor (TFT), a pixel region, and a storage capacitor on the substrate;
   forming a passivation layer on the contact pad, the TFT, the pixel region, and the storage capacitor;
   forming a patterned photoresist layer on the passivation layer;
   removing part of the passivation layer uncovered by the patterned photoresist layer to expose the pixel region, part of the TFT, part of the storage capacitor, and part of the contact pad;
   forming a transparent conductive layer on the patterned photoresist layer, on the exposed pixel region, on the exposed part of the TFT, on the exposed part of the storage capacitor, and on the exposed part of the contact pad; and applying a laser ablation process to remove the patterned photoresist layer and the transparent conductive layer on the patterned photoresist layer, so that the transparent conductive layer remains on the pixel region, on the part of the TFT, on the part of the storage capacitor, and on the part of the contact pad.

2. The method of claim 1, wherein the transparent conductive layer comprises transparent metal oxide.

3. The method of claim 2, wherein the transparent metal oxide comprises indium tin oxide, indium zinc oxide, cadmium tin oxide, aluminum zinc oxide, or combinations thereof.

4. The method of claim 1, wherein the laser ablation process has an energy of about 650 mJ to about 1800 mJ.

5. The method of claim 1, wherein the laser ablation process has a wavelength substantially greater than or substantially equal to 900 nm.

6. The method of claim 1, wherein the passivation layer comprises organic material, inorganic material, or combinations thereof.

7. The method of claim 1, wherein the passivation layer comprises silicon nitride, silicon oxide, silicon oxynitride, silicon carbide, silicon oxycarbide, or combinations thereof.

8. The method of claim 1, wherein the passivation layer comprises organic silicon compound or organic polymer.

9. The method of claim 6, wherein the organic material has a bond dissociation energy substantially greater than or substantially equal to an energy of the laser ablation process.

10. The method of claim 1, wherein the formation of the contact pad, the TFT, the pixel region, and the storage capacitor on the substrate comprises:

forming a first patterned metal layer on the substrate to form a gate electrode of the TFT, a bottom electrode of the storage capacitor, the contact pad, and to expose the substrate in the pixel region;

forming a dielectric layer on the exposed part of the substrate in the pixel region, on the contact pad, on the gate electrode of the TFT, and on the bottom electrode;

forming a channel layer and an ohmic contact layer on the gate electrode of the TFT;

forming a second patterned metal layer on the substrate to form source/drain electrodes of the TFT and a top electrode of the storage capacitor;

removing the part of the ohmic contact layer un-covered by the source/drain electrodes to expose part of the channel layer.

11. The method of claim 10, further comprising forming an etch stop layer between the channel layer and the ohmic contact layer.

12. The method of claim 1, wherein the formation of the contact pad, the TFT, the pixel region, and the storage capacitor on the substrate comprises:

forming a first patterned metal layer on the substrate to form a gate electrode of the TFT, a bottom electrode of the storage capacitor, contact pad, and to expose the substrate in the pixel region;

forming a dielectric layer, a channel layer, an ohmic contact layer, a second metal layer, and a photoresist layer on the contact pad, on the gate electrode, on the bottom electrode, and on the substrate in the pixel region;

patterning the photoresist layer to form a thin photoresist region and a thick photoresist region, so that the thin photoresist region substantially aligns with the gate electrode, and the thick photoresist region substantially aligns with the bottom electrode and two sides of the gate electrode;

removing the part of the second metal layer un-covered by the thin photoresist region and the thick photoresist region;

removing the thin photoresist region;

removing the part of the second metal layer and the part of the ohmic contact layer on the gate electrode to expose part of the channel layer, and removing the part of the ohmic contact layer and the part of the channel layer un-covered by the thick photoresist layer, so that the un-removed part of the second metal layer acts as source/drain electrodes of the TFT and a top electrode of the storage capacitor; and removing the thick photoresist region.

13. The method of claim 12, further comprising forming an etch stop layer between the channel layer and the ohmic contact layer.

14. The method of claim 1, wherein the formation of the contact pad, the TFT, the pixel region, and the storage capacitor on the substrate respectively comprises:

forming a first patterned metal layer on the substrate to form a gate electrode of the TFT, a bottom electrode of the storage capacitor, contact pad, and to expose the substrate of the pixel region;

forming a dielectric layer, a channel layer, an ohmic contact layer, a second metal layer, and a photoresist layer on the contact pad, on the gate electrode, on the bottom electrode, and on the substrate of the pixel region;

patterning the photoresist layer to form a thin photoresist region and a thick photoresist region, so that the thin photoresist region substantially aligns with the gate electrode, and the thick photoresist region substantially aligns with the bottom electrode and two sides of the gate electrode;

removing part of the second metal layer, part of the ohmic contact layer, and part of the channel layer un-covered by the thin photoresist region and the thick photoresist region to expose part of the dielectric layer;

removing the thin photoresist region;

removing the part of the second metal layer and the part of the ohmic contact layer on the gate electrode to expose the part of the channel layer, so that the un-removed part of the second metal layer acts as source/drain electrodes of the TFT and a top electrode of the storage capacitor; and removing the thick photoresist region.

15. The method of claim 14, further comprising forming an etch stop layer between the channel layer and the ohmic contact layer.

16. A method for making an electro-optical apparatus incorporating the method of claim 1.

* * * * *